United States Patent [19]

Tai

[11] Patent Number: 5,220,586
[45] Date of Patent: Jun. 15, 1993

[54] CIRCUITRY AND METHOD FOR VARIABLE SINGLE TRANSITION COUNTING

[75] Inventor: Jy-Der Tai, Plano, Tex.

[73] Assignee: Texas Instruments Incorporated, Dallas, Tex.

[21] Appl. No.: 938,575

[22] Filed: Aug. 31, 1992

Related U.S. Application Data

[63] Continuation of Ser. No. 814,848, Dec. 30, 1991, abandoned.

[51] Int. Cl.$^5$ .............................................. G11C 7/00
[52] U.S. Cl. ........................................ 377/39; 377/34; 365/189.07; 365/189.04
[58] Field of Search ............... 377/39, 34; 365/189.07, 365/189.04

[56] References Cited

U.S. PATENT DOCUMENTS

| | | | |
|---|---|---|---|
| 4,757,464 | 7/1988 | Zimmerman et al. | 377/39 |
| 5,084,841 | 1/1992 | Williams et al. | 377/34 |
| 5,157,701 | 10/1992 | Parker | 377/39 |

*Primary Examiner*—William L. Sikes
*Assistant Examiner*—Scott A. Ouellette
*Attorney, Agent, or Firm*—Stanton C. Braden; Richard Donaldson

[57] ABSTRACT

In a method and circuitry for variable single transition counting, a count signal (178) is provided on a count line. A direction control bit (264) is output on a direction control line. A significant bit (278e) is output on a significant bit line. A first single transition count (278a–d) is incremented in response to the count signal (178) and to the direction control bit (264) having an incrementing logic state. The first single transition count (278a–d) is decremented in response to the count signal (178) and to the direction control bit (264) having a decrementing logic state. The first single transition count (278a–d) and the significant bit (278e) together form a second single transition count (278a–e). The second single transition count (278a–e) is compared against a preselected value (296), and a comparison signal (320) is output in response to the second single transition count (278a–e) being equal to the preselected value (296). The direction control bit (264) and the significant bit (278e) are toggled in response to the comparison signal (320), such that a value of the second single transition count (278a–e) may be changed in response to the preselected value (296).

31 Claims, 3 Drawing Sheets

CIRCUITRY AND METHOD FOR VARIABLE SINGLE TRANSITION COUNTING

This application is a continuation of application Ser. No. 07/814,848, filed Dec. 30, 1991 now abandoned.

CROSS-REFERENCE TO RELATED APPLICATIONS

This application is related to U.S. Pat. application Ser. No. 07/814881, filed concurrently herewith, entitled "Circuitry and Method for Modularized Single Transition Counting".

TECHNICAL FIELD OF THE INVENTION

This invention relates in general to electronic circuitry and in particular to a method and circuitry for variable single transition counting.

BACKGROUND OF THE INVENTION

In a typical first-in-first-out ("FIFO") memory, a write index and a read index are used to determine whether the FIFO is empty or full. The write and read indices may be maintained by a counter. If a synchronous binary counter is used to maintain the write and read indices, then two or more digital logic bits of the synchronous binary counter may simultaneously change at a particular time in response to a clock signal, resulting in undesirable transition noise and complex timing conditions. If a single transition counter is used to maintain the write and read indices, then only one digital logic bit of the counter changes in response to a particular clock signal.

In order to maintain either the write or read indices, a synchronous binary counter or a single transition counter is reset to initially begin counting at an initial value. Typically, the counter's value is repeatedly incremented in response to positive-edge transitions of a clock signal, until the counter reaches its maximum value. When the counter reaches its maximum value, the next positive-edge transition of the clock signal results in the counter being automatically reset to its initial value. By design, the number of clock signals necessary for a typical counter to cycle from its initial value through to its maximum value and then back to its initial value is a power of two ($2^n$, where n is the number of digital logic bits or output signals of the counter). For a typical binary counter, a variable count may be achieved, such that the number of clock signals necessary for the counter to cycle from its initial value through to its maximum value and then back to its initial value is not a power of two. To achieve such a variable count in a binary counter, a decoder detects when the counter reaches a specified maximum count, and the decoder thereupon resets the binary counter to its initial value. However, it is undesirable to apply the same approach to a single transition counter in order to achieve such a variable count, because more than one output signal of the single transition counter may change when the decoder resets the single transition counter to its initial value. In a FIFO, a variable count is desirable for the write and read indices, so that the number of storage locations in the FIFO is not required to be a power of two.

Consequently, a need has arisen for a method and circuitry for variable single transition counting in which only one digital logic bit of a variable single transition count changes in response to a clock signal.

SUMMARY OF THE INVENTION

In a method and circuitry for variable single transition counting, a count signal is provided on a count line. A direction control bit is output on a direction control line. A significant bit is output on a significant bit line. A first single transition count is incremented in response to the count signal and to the direction control bit having an incrementing logic state. The first single transition count is decremented in response to the count signal and to the direction control bit having a decrementing logic state. The first single transition count and the significant bit together form a second single transition count. The second single transition count is compared against a preselected value, and a comparison signal is output in response to the second single transition count being equal to the preselected value. The direction control bit and the significant bit are toggled in response to the comparison signal, such that a value of the second single transition count may be changed in response to the preselected value.

It is a technical advantage of the present invention that only one bit of a single transition count changes in response to the count signal.

It is another technical advantage of the present invention that a variable single transition count is achieved such that a number of count signals necessary for the count to cycle from an initial value through to a maximum value and then back to the initial value is not required to be a power of two.

It is yet another technical advantage of the present invention that a decoder is not required to achieve the variable single transition count.

It is a further technical advantage of the present invention that a number of storage locations in a FIFO is not required to be a power of two.

BRIEF DESCRIPTION OF THE DRAWINGS

For a more complete understanding of the present invention, and the advantages thereof, reference is now made to the following descriptions, taken in conjunction with the accompanying drawings, in which.

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1:
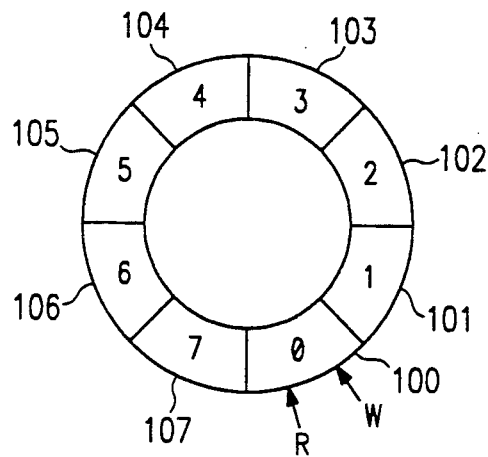
FIG. 1 is a conceptual representation of a FIFO.

FIG. 1 is a conceptual representation of a FIFO. Memory locations 100, 101, 102, 103, 104, 105, 106, and 107 are arranged conceptually in a circular fashion as shown in FIG. 1. A write index W indicates a memory location at which new data are to be stored. After new data are stored at the indicated memory location, write index W is incremented to indicate the next adjacent memory location. A read index R indicates a memory location from which data are to be read. After data are read from the indicated memory location, read index R is incremented to indicate the next adjacent memory location.

As shown in FIG. 1, write index W initially indicates that new data are to be written at memory location 100. After data are written to memory location 100, write index W is incremented to indicate that new data are to be written at the next adjacent memory location 101. As additional data are written to sequential memory locations in the FIFO, write index W is incremented after each write operation to indicate the next adjacent memory location, until data are ultimately written at memory location 107, at which time write index W is reset to indicate memory location 100.

As shown in FIG. 1, read index R initially indicates that data are to be read from memory location 100. After data are read from memory location 100, read index R is incremented to indicate that data are to be read from the next adjacent memory location 101. As additional data are read from sequential memory locations in the FIFO, read index R is incremented after each read operation to indicate the next adjacent memory location, until data are ultimately read from memory location 107, at which time read index R is reset to indicate memory location 100.

If write index W is ever incremented to indicate a memory location which is also indicated by read index R, then the FIFO is full, and no additional data may be written to the FIFO until data are read from the indicated memory location such that read index R is incremented to no longer indicate the same memory location as write index W. If read index R is ever incremented to indicate a memory location which is also indicated by write index W, then the FIFO is empty, and no additional data may be read from the FIFO until data are written to the indicated memory location such that write index W is incremented to no longer indicate the same memory location as read index R.

Figure 2:
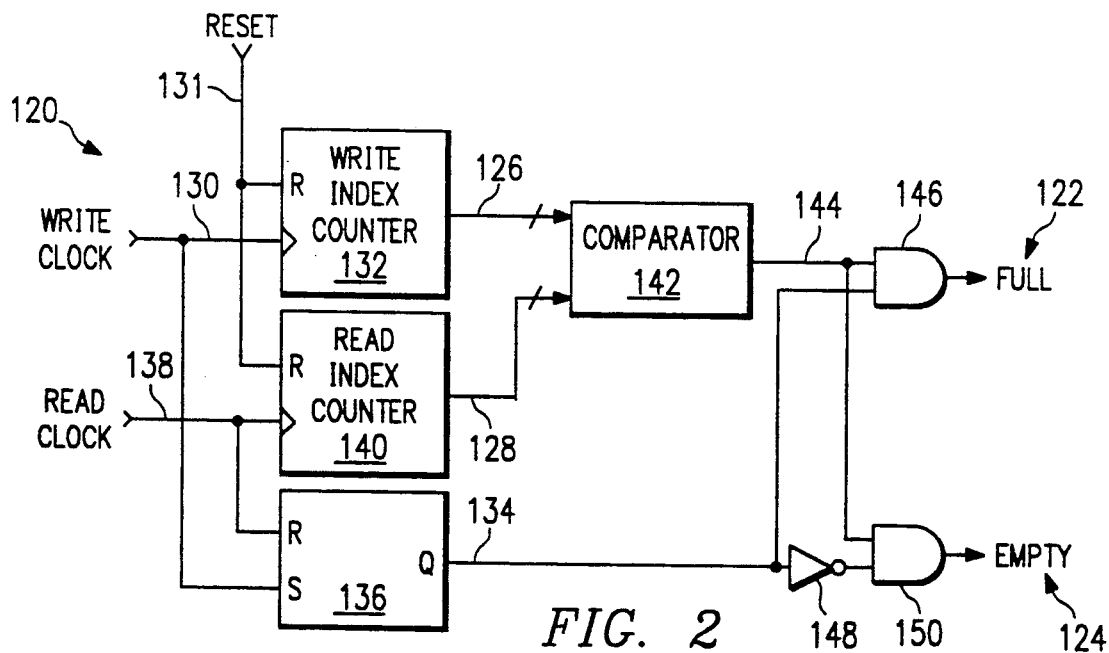
FIG. 2 is a schematic block diagram of an exemplary embodiment of circuitry for generating a FULL flag and an EMPTY flag for a FIFO, based upon a comparison of write and read indices.

FIG. 2 is a schematic block diagram of an exemplary embodiment of circuitry 120 for generating a FULL flag 122 and an EMPTY flag 124 for a FIFO, based upon a comparison of a value of write index W on lines 126 and a value of read index R on lines 128. When data are written to the FIFO, a WRITE CLOCK pulse is input on line 130, such that a write index counter 132 increments write index W, and such that a latch 136 sets an output 134 to a logic "1". When data are read from the FIFO, a READ CLOCK pulse is input on line 138, such that a read index counter 140 increments read index R, and such that latch 136 resets output 134 to a logic "0". A comparator 142 compares write index W against read index R, such that a signal 144 is set to a logic "1" if write index W is equal to read index R. Consequently, if signal 144 is set to a logic "1", and if output 134 is set to a logic "1", then an AND gate 146 sets FULL flag 122 to a logic "1" in order to indicate that the FIFO is full, because output 134 and signal 144 together indicate write index W was incremented to indicate the same memory location as read index R. If signal 144 is set to a logic "1", and if output 134 is reset to a logic "0", then read index R was incremented to indicate the same memory location as write index W; thus, an inverter 148 inverts output 134 such that an AND gate 150 sets EMPTY flag 124 to a logic "1" in order to indicate that the FIFO is empty. Latch 136 may be replaced by alternative circuitry for outputting a signal equivalent to output 134, in order to indicate whether the FIFO is either full or empty when write index W is equal to read index R. Upon resetting circuitry 120 of FIG. 2, output 134 of flip-flop 136 is reset to a logic "0"; moreover, write count 126 and read count 128 are each reset to a zero count by asserting reset line 131, such that signal 144 of comparator 142 is set to a logic "1", and such that EMPTY flag 124 is consequently set to a logic "1" in order to indicate that the FIFO is empty.

Figure 3:
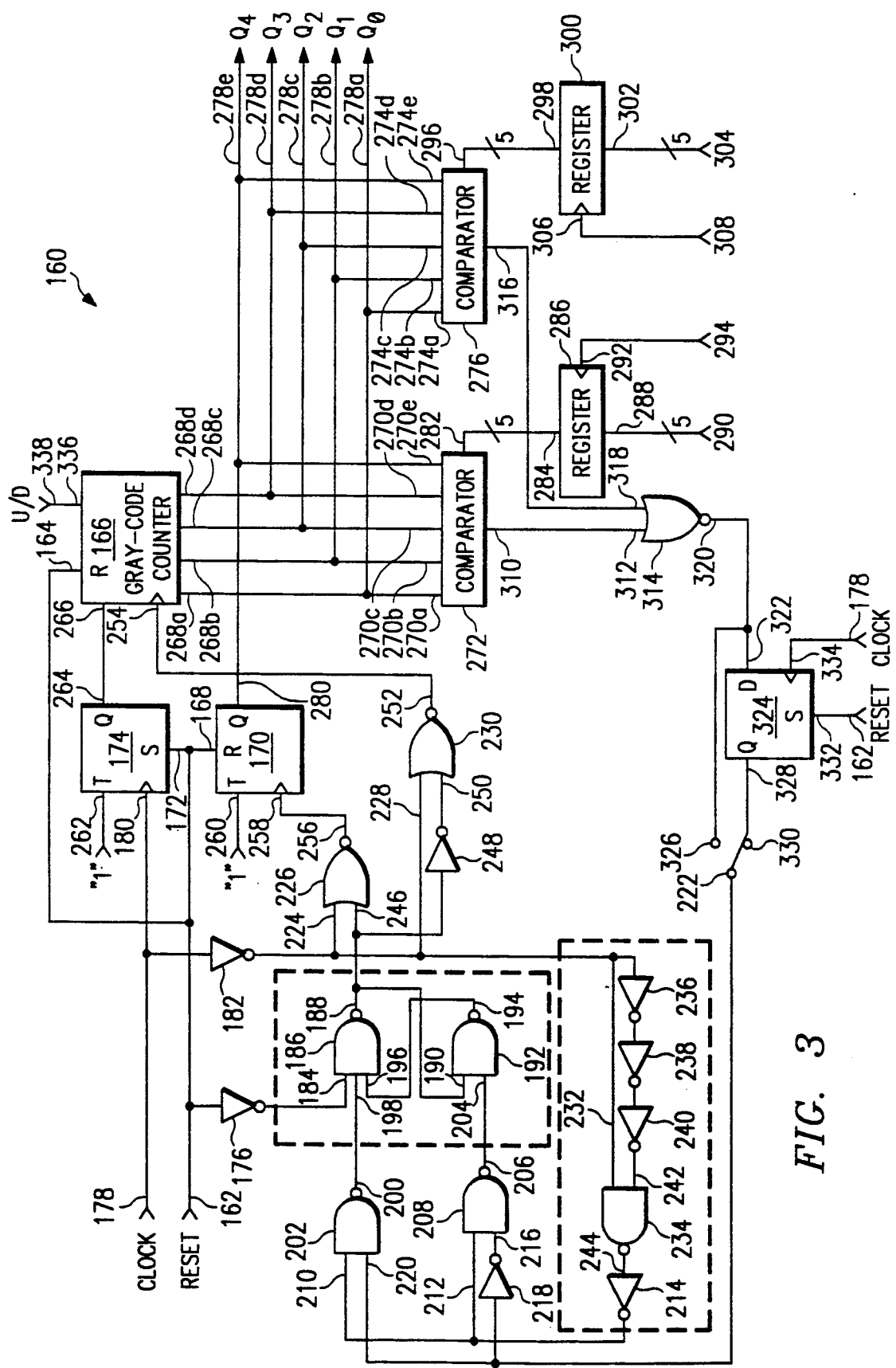
FIG. 3 is a schematic electrical circuit diagram of circuitry for variable single transition counting, according to the preferred embodiment.

FIG. 3 is a schematic electrical circuit diagram of circuitry, indicated generally at 160, for variable single transition counting, according to the preferred embodiment. A RESET signal on line 162 is coupled to a reset input 164 of a gray-code single transition counter 166, to a reset input 168 of a T=type flip-flop 170, to a set input 172 of a T-type flip-flop 174, and to an input of an inverter 176. A count or clock signal 178 is coupled to a clock input 180 of flip-flop 174 and to an input of an inverter 182.

An output of inverter 176 is coupled to a first input 184 of a NAND gate 186. An output 188 of NAND gate 186 is coupled to a first input 190 of a NAND gate 192. An output 194 of NAND gate 192 is coupled to a second input 196 of NAND gate 186. A third input 198 of NAND gate 186 is coupled to an output 200 of a NAND gate 202. A second input 204 of NAND gate 192 is coupled to an output 206 of a NAND gate 208. A first input 210 of NAND gate 202 is coupled to a first input 212 of NAND gate 208 and to an output of an inverter 214. A second input 216 of NAND gate 208 is coupled to an output of an inverter 218. A second input 220 of NAND gate 202 is coupled to an input of an inverter 218 and to a node 222. An output of inverter 182 is coupled to a first input 224 of a NOR gate 226, to a first input 228 of a NOR gate 230, to a first input 232 of a NAND gate 234, and to an input of inverter 236. An output of inverter 236 is coupled to an input of an inverter 238 whose output is coupled to an input of an inverter 240. An output of inverter 240 is coupled to a second input 242 of NAND gate 234. An output 244 of NAND gate 234 is coupled to an input of inverter 214. A second input 246 of NOR gate 226 is coupled to output 188 of NAND gate 186 and to an input of an inverter 248. An output of inverter 248 is coupled to a second input 250 of NOR gate 230. An output 252 of NOR gate 230 is coupled to a clock input 254 of gray-code single transition counter 166. An output 256 of NOR gate 226 is coupled to a clock input 258 of flip-flop 170. A T-input 260 of flip-flop 170 is coupled to a high voltage source to represent a logic "one". A T-input 262 of flip-flop 174 is coupled to a logic "one". An "invisible" bit output 264 of flip-flop 174 is coupled to an "invisible" bit input 266 of gray-code single transition counter 166. Outputs 268a, 268b, 268c, and 268d of gray-code single transition counter 166 are coupled to inputs 270a, 270b, 270c, and 270d, respectively, of a comparator 272. Outputs 268a–d of gray-code single transition counter 166 are further coupled to inputs 274a, 274b, 274c, and 274d, respectively, of a comparator 276. Outputs 268a–d of gray-code single transition counter 166 form single transition counter outputs 278a($Q_0$), 278b($Q_1$), 278c($Q_2$), and 278d($Q_3$), respectively. An output 280 of flip-flop 170 is coupled to an input 270e of comparator 272, and to an input 274e of comparator 276; also, output 280 of flip-flop 170 forms single transition counter output 278e ($Q_4$). A parallel 5-bit comparison data input 282 of comparator 272 is coupled to a parallel 5-bit comparison data output 284 of a register 286. A parallel 5-bit data input 288 of register 286 is coupled to a parallel 5-bit data source 290. A clock input 292 of register 286 is coupled to a load signal 294. A parallel 5-bit comparison data input 296 of comparator 276 is coupled to a parallel 5-bit comparison data output 298 of a register 300. A parallel 5-bit data input 302 of register 300 is coupled to a parallel 5-bit data source 304. A clock input 306 of register 300 is coupled to a load signal 308. An output 310 of comparator 272 is coupled to a first input 312 of a NOR gate 314. An output 316 of comparator 276 is coupled to a second input 318 of NOR gate 314. An output 320 of NOR gate 314 is coupled to a D-input 322 of a D-type flip-flop 324 and is further coupled to a node 326 An output 328 of flip-flop 324 is coupled to a node 330. A set input 332 of flip-flop 324 is coupled to RESET signal on line 162 A clock input 334 of flip-flop 324 is coupled to a clock signal 178.

Figure 4:
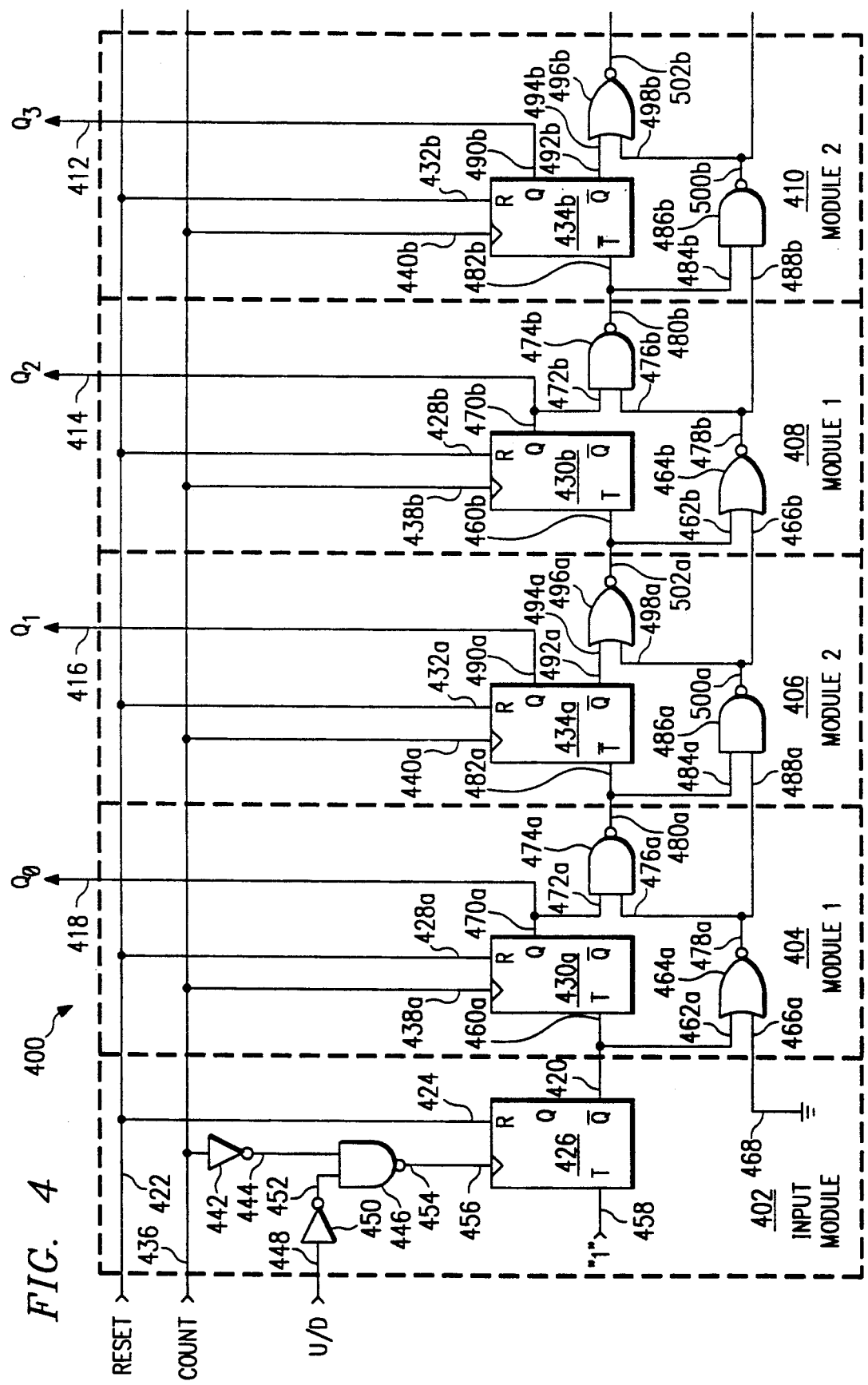
FIG. 4 is a schematic electrical circuit diagram of a modularized gray-code single transition counter of the preferred embodiment.

FIG. 4 is a schematic electrical circuit diagram of a modularized gray-code single transition counter 400 of the preferred embodiment. Gray-code single transition counter 400 forms gray-code single transition counter 166 of FIG. 3. An input module 402 is coupled to a cell 404, which is coupled to a cell 406. Cell 406 is coupled to a cell 408, which is coupled to a cell 410. As FIG. 4 illustrates, cells 404 and 408 are identical reproductions of Module 1. Cells 406 and 410 are identical reproductions of Module 2. Counter 400 provides a gray-code single transition count on outputs 412 (most significant bit $Q_3$), 414 ($Q_2$), 416 ($Q_1$), and 418 (least significant bit $Q_0$). Output 412 is provided by cell 410, output 414 is provided by cell 408, output 416 is provided by cell 406, and output 418 is provided by cell 404. By alternately duplicating Module 1 and Module 2 in the same manner as shown in FIG. 4, bits may be added to modularized gray-code single transition counter 400 to achieve a predetermined maximum output. For example, an additional bit ($Q_4$) (not shown) may be added as the most significant bit of modularized gray-code single transition counter 400 by coupling cell 410 to an additional cell comprising an exact duplication of Module 1.

In addition to outputs 412–418, an "invisible" bit is provided by input module 402 on an inverted output 420 of flip-flop 426. Table 1 illustrates sequential gray-code values output by counter 400, along with corresponding values of the "invisible" bit provided on output 420 for both incrementing and decrementing modes.

TABLE 1

| | | | | GRAY-CODE SINGLE TRANSITION COUNT | | |
|---|---|---|---|---|---|---|
| $Q_3$ (MSB) | $Q_2$ | $Q_1$ | $Q_0$ (LSB) | INVISIBLE BIT (INCREMENTING) | INVISIBLE BIT (DECREMENTING) | DECIMAL VALUE |
| 0 | 0 | 0 | 0 | 1 | 0 | 0 |
| 0 | 0 | 0 | 1 | 0 | 1 | 1 |
| 0 | 0 | 1 | 1 | 1 | 0 | 2 |
| 0 | 0 | 1 | 0 | 0 | 1 | 3 |
| 0 | 1 | 1 | 0 | 1 | 0 | 4 |
| 0 | 1 | 1 | 1 | 0 | 1 | 5 |
| 0 | 1 | 0 | 1 | 1 | 0 | 6 |
| 0 | 1 | 0 | 0 | 0 | 1 | 7 |
| 1 | 1 | 0 | 0 | 1 | 0 | 8 |
| 1 | 1 | 0 | 1 | 0 | 1 | 9 |
| 1 | 1 | 1 | 1 | 1 | 0 | 10 |
| 1 | 1 | 1 | 0 | 0 | 1 | 11 |
| 1 | 0 | 1 | 0 | 1 | 0 | 12 |
| 1 | 0 | 1 | 1 | 0 | 1 | 13 |
| 1 | 0 | 0 | 1 | 1 | 0 | 14 |
| 1 | 0 | 0 | 0 | 0 | 1 | 15 |
| 0 | 0 | 0 | 0 | 1 | 0 | 0 |

As Table 1 illustrates, the "invisible" bit toggles between "0⇌" and "1" at each successive count. At each successive count, $Q_0$ toggles between "0⇌" and "1" only if the "invisible" bit of the previous count has a logic value of "1". At each successive count, $Q_1$ toggles between "0⇌" and "1" only if $Q_0$ of the previous count has a logic value of "1" and if the "invisible" bit of the previous count has a logic value of "0". At each successive count, $Q_2$ toggles between "0" and "1" only if $Q_1$ of the previous count has a logic value of "1" and if $Q_0$ and the "invisible" bit of the previous count each have a logic value of "0". At each successive count, $Q_3$ toggles between "0⇌" and "1" only if $Q_2$ of the previous count has a logic value of "1" and if $Q_1$, $Q_0$ and the "invisible" bit of the previous count each have a logic value of "0". Applying these rules of Table 1, the "invisible" bit controls a direction of counting to determine whether a successive count is incremented or decremented relative to the previous count.

In FIG. 4, a RESET signal line 422 is coupled to a reset input 424 of a T-type flip-flop 426, to reset inputs 428a and 428b of T-type flip-flops 430a and 430b, respectively, and to reset inputs 432a and 432b of T-type flip-flops 434a and 434b, respectively. A COUNT signal line 436 is coupled to clock inputs 438a and 438b of flip-flops 430a and 430b, respectively, and to clock inputs 440a and 440b of flip-flops 434a and 434b, respectively. COUNT signal line 436 is further coupled through an inverter 442 to a first input 444 of a NAND gate 446. An up/down (U/D) signal 448 is coupled through an inverter 450 to a second input 452 of NAND gate 446. An output 454 of NAND gate 446 is coupled to a clock input 456 of flip-flop 426. An input 458 of flip-flop 426 is coupled to a logic "1". Inverted output 420 of flip-flop 426 is coupled to an input 460a of flip-flop 430a and also to a first input 462a of a NOR gate 464a. A second input 466a of NOR gate 464a is coupled to a ground line 468. A non-inverted output 470a of flip-flop 430a is coupled to output 418 ($Q_0$) and to a first input 472a of a NAND gate 474a. A second input 476a of NAND gate 474a is coupled to an output 478a of NOR gate 464a. An output 480a of NAND gate 474a is coupled to an inverted input 482a of flip-flop 434a and to a first input 484a of a NAND gate 486a. A second input 488a of NAND gate 486a is coupled to output 478a of NOR gate 464a. A non-inverted output 490a of flip-flop 434a is coupled to output 416 ($Q_1$). An inverted output 492a of flip-flop 434a is coupled to a first input 494a of a NOR gate 496a. A second input 498a of NOR gate 496a is coupled to an output 500a of NAND gate 486a. An output 502a of NOR gate 496a is coupled to an input 460b of flip-flop 430b and to a first input 462b of a NOR gate 464b. A second input 466b of NOR gate 464b is coupled to output 500a of NAND gate 486a. A non-inverted output 470b of flip-flop 430b is coupled to output 414 ($Q_2$) and to a first input 472b of a NAND gate 474b. A second input 476b of NAND gate 474b is coupled to an output 478b of NOR gate 464b. An output 480b of NAND gate 474b is coupled to an inverted input 482b of flip-flop 434b and to a first input 484b of a NAND gate 486b. A second input 488b of NAND gate 486b is coupled to output 478b of NOR gate 464b. A non-inverted output 490b of flip-flop 434b is coupled to output 412 ($Q_3$). An inverted output 492b of flip-flop of 434b is coupled to a first input 494b of a NOR gate 496b. A second input 498b of NOR gate 496b is coupled to an output 500b of NAND gate 484b. An output 502b of NOR gate 496b and output 500b of NAND gate 486b may be optionally coupled to an additional cell comprising a reproduction of Module 1, in the same manner in which cell 406 is coupled to cell 408.

Modularized gray-code single transition counter 400 operates in accordance with the rules described above in connection with Table 1. When RESET signal line 422 is asserted, outputs $Q_3$, $Q_2$, $Q_1$ and $Q_0$ are each reset to a logic value of "0", outputs 420 and 492a–b are each set to a logic value of "1", and outputs 470a–b and 490a–b are each reset to a logic value of "0".

In an alternative embodiment, RESET signal line 422 is coupled to one or more set inputs (not shown) of flip-flops 430a, 430b, 434a and 434b, such that one or more of outputs $Q_3$, $Q_2$, $Q_1$ and $Q_0$ is set to a logic value of "1" when RESET signal line 422 is asserted. In this manner, outputs $Q_3$, $Q_2$, $Q_1$ and $Q_0$ can be initialized to any predetermined value when RESET signal line 422 is asserted, based upon whether RESET signal line 422 is coupled to a reset input or to a set input of each of flip-flops 430a, 430b, 434a and 434b. Similarly, RESET signal line 422 alternatively can be coupled to a set input (not shown) of flip flop 426, such that output 420 is reset to a logic value of "0⇌" when RESET signal line 422 is asserted. In this manner, the "invisible" bit provided by output 420 of flip-flop 426 can be initialized to a logic value of either "1" or "0", based upon whether RESET signal line 422 is coupled to a reset input or to a set input of flip-flop 426.

In the preferred embodiment, up/down (U/D) signal 448 is initially reset to a low (logic "0") state, resulting in input 452 of NAND gate 446 being high (logic "1"); consequently, if COUNT signal line 436 is low, then input 444 of NAND gate 446 is high, and output 454 of NAND gate 446 is consequently low, thereby mirroring the logic state of COUNT signal line 436. Similarly, if COUNT signal line 436 is high, then input 444 of NAND gate 446 is low, and output 454 of NAND gate 446 is consequently high, thereby mirroring the logic state of COUNT signal line 436. Since output 454 of NAND gate 446 (coupled to clock input 456 of flip-flop 426) mirrors the logic state of count signal 436 when up/down (U/D) signal 448 is low, and since output 420 ("invisible" bit) is initially set to a logic value of "1", each positive edge transition of COUNT signal line 436 initially results in an incremented gray-code single transition count on outputs 412-418 ($Q_3$, $Q_2$, $Q_1$, $Q_0$) in accordance with the rules discussed above in connection with Table 1.

Output 470a ($Q_0$) of flip-flop 430a toggles between "0⇌" and "1" if "invisible" bit output 420 (coupled to status input 460a of flip-flop 430a) has a logic value of "1".

Output 490a ($Q_1$) of flip-flop 434a toggles between "0⇌" and "1" if output 480a of NAND gate 474a (coupled to inverted status input 482a of flip-flop 434a) has a logic value of "0", which indicates that output 470a ($Q_0$) has a logic value of "1" and also that "invisible" bit output 420 has a logic value of "0" (indicated by indication output 478a of NOR gate 464a having a logic value of "1").

Output 470b ($Q_2$) of flip-flop 430b toggles between "0" and "1" if output 502a of NOR gate 496a (coupled to status input 460b of flip-flop 430b) has a logic value of "1", which indicates that output 490a ($Q_1$) has a logic value of "1" (indicated by inverted output 492a having a logic value of "0") and also that output 40u ($Q_0$) and "invisible" bit output 420 each have logic a value of "0⇌ (indicated by output 478a of NOR gate 464a having a logic value of "1" and by output 480a of NAND gate 474a also having a logic value of "1", resulting in indication output 500a of NAND gate 486a having a logic value of "0").

Output 490b ($Q_3$) of flip-flop 434b toggles between "0⇌ and 480b if output 480b of NAND gate 474b (coupled to inverted status input 482b of flip-flop 434b) has a logic value of "0", which indicates that output 470b ($Q_2$) has a logic value of "1") and also that output 490a ($Q_1$), output 470a ($Q_0$) and "invisible" bit output 420 each have a logic value of "0⇌ (indicated by output 478a of NOR gate 464a having a logic value of "1" and by output 480a of NAND gate 474a also having a logic value of "1", resulting in output 500a of NAND gate 486a having a logic value of "0", and further indicated by inverted output 492a of flip-flop 434a having a logic value of "1", resulting in inputs 462b and 466b of NOR gate 464b each having a logic value of "0", such that indication output 478b of NOR gate 464b has a logic value of "1").

Consequently, modularized gray-code single transition counter 400 outputs a gray-code single transition count in accordance with the rules described above in connection with Table 1. Applying the rules of Table 1, "invisible" bit output 420 controls a direction of counting to determine whether a successive count is incremented or decremented relative to the previous count.

When RESET signal line 422 is asserted, outputs 412 ($Q_3$), 414 ($Q_2$), 416 ($Q_1$) and 418 ($Q_0$) each have a logic value of "0". The assertion of RESET signal line 422 also results in "invisible" bit output 420 being set to a logic value of "1", thereby placing gray-code single transition counter 400 in an incrementing mode according to Table 1. Subsequently, gray-code single transition counter 400 may be placed in a decrementing mode according to Table 1 by toggling the "invisible" bit output 420 between "0⇌ and "1" while simultaneously leaving outputs 412 ($Q_3$), 414 ($Q_2$), 416 ($Q_1$) and 418 ($Q_0$) unchanged. Thus, gray-code single transition counter 400 may be placed in a decrementing mode by applying a positive pulse to up/down (U/D) signal 448 at any time while COUNT signal line 436 has a low state; in that case, the positive pulse applied to up/down (U/D) signal 448 results in a negative pulse at input 452 of NAND gate 446, consequently resulting in a positive pulse at output 454 of NAND gate 446 which is applied to clock input 456 of flip-flop 426, thereby toggling "invisible" bit output 420 without changing the outputs of flip-flops 430a–b and 434a–b. After such a positive pulse is applied to up/down (U/D) signal 448, up/down (U/D) signal 448 returns to its previous low state, and output 454 of NAND gate 446 (coupled to clock input 456 of flip-flop 426) resumes its normal operation of mirroring the logic state of COUNT signal line 436. Gray-code single transition counter 400 returns to the incrementing mode from the decrementing mode if another positive pulse is applied to up/down (U/D) signal 448 at any time while COUNT signal line 436 has a low state. In an alternative embodiment, the switching between incrementing and decrementing modes can be level triggered by inserting an edge detector circuit between U/D signal 448 and inverter 450. Thus, modularized gray-code single transition counter 400 executes both the incrementing and decrementing counting approaches described above in connection with Table 1, while requiring a relatively small number of logic gates, while consuming a relatively small amount of power, and while occupying a relatively small integrated circuit area in comparison to previous approaches. Counter 400 has a relatively fast counting speed due to its relatively small number of logic gates. Moreover, the modularized design of gray-code single transition counter 400 is particularly well-suited for ASIC compiler programs, such that integrated circuit designs produced by ASIC compiler programs are more simplified, easier to troubleshoot, and easier to analyze in terms of operating characteristics. Gray-code single transition counter 400 forms gray-code single transition counter 166 and T-type flip-flop 174 of FIG. 3. Specifically, RESET signal on line 422 of FIG. 4 corresponds to RESET signal on line 162 of FIG. 3, count signal 436 of FIG. 4 corresponds to clock signal 178 of FIG. 3, "invisible" bit output 420 of FIG. 4 corresponds to "invisible" bit output 264 of FIG. 3, output 412 of FIG. 4 corresponds to output 268d of FIG. 3, output 414 of FIG. 4 corresponds to output 268c of FIG. 3, output 416 of FIG. 4 corresponds to output 268b of FIG. 3, and output 418 of FIG. 4 corresponds to output 268a of FIG. 3.

With reference to FIG. 3, Table 2 illustrates sequential single transition values output by circuitry 160 for variable single transition counting, along with corresponding values of the "invisible" bit provided on output 264 of flip-flop 174 for both incrementing and decrementing modes of counting.

TABLE 2

| $Q_4$ (MSB) | $Q_3$ | $Q_2$ | $Q_1$ | $Q_0$ (LSB) | INVISIBLE BIT (INCREMENTING) | INVISIBLE BIT (DECREMENTING) | DECIMAL VALUE |
|---|---|---|---|---|---|---|---|
| 0 | 0 | 0 | 0 | 0 | 1 | 0 | 0 |
| 0 | 0 | 0 | 0 | 1 | 0 | 1 | 1 |
| 0 | 0 | 0 | 1 | 1 | 1 | 0 | 2 |
| 0 | 0 | 0 | 1 | 0 | 0 | 1 | 3 |
| 0 | 0 | 1 | 1 | 0 | 1 | 0 | 4 |
| 0 | 0 | 1 | 1 | 1 | 0 | 1 | 5 |
| 0 | 0 | 1 | 0 | 1 | 1 | 0 | 6 |
| 0 | 0 | 1 | 0 | 0 | 0 | 1 | 7 |
| 0 | 1 | 1 | 0 | 0 | 1 | 0 | 8 |
| 0 | 1 | 1 | 0 | 1 | 0 | 1 | 9 |
| 0 | 1 | 1 | 1 | 1 | 1 | 0 | 10 |
| 0 | 1 | 1 | 1 | 0 | 0 | 1 | 11 |
| 0 | 1 | 0 | 1 | 0 | 1 | 0 | 12 |
| 0 | 1 | 0 | 1 | 1 | 0 | 1 | 13 |
| 0 | 1 | 0 | 0 | 1 | 1 | 0 | 14 |
| 0 | 1 | 0 | 0 | 0 | 0 | 1 | 15 |
| 1 | 1 | 0 | 0 | 0 | 1 | 0 | 16 |
| 1 | 1 | 0 | 0 | 1 | 0 | 1 | 17 |
| 1 | 1 | 0 | 1 | 1 | 1 | 0 | 18 |
| 1 | 1 | 0 | 1 | 0 | 0 | 1 | 19 |
| 1 | 1 | 1 | 1 | 0 | 1 | 0 | 20 |
| 1 | 1 | 1 | 1 | 1 | 0 | 1 | 21 |
| 1 | 1 | 1 | 0 | 1 | 1 | 0 | 22 |
| 1 | 1 | 1 | 0 | 0 | 0 | 1 | 23 |
| 1 | 0 | 1 | 0 | 0 | 1 | 0 | 24 |
| 1 | 0 | 1 | 0 | 1 | 0 | 1 | 25 |
| 1 | 0 | 1 | 1 | 1 | 1 | 0 | 26 |
| 1 | 0 | 1 | 1 | 0 | 0 | 1 | 27 |
| 1 | 0 | 0 | 1 | 0 | 1 | 0 | 28 |
| 1 | 0 | 0 | 1 | 1 | 0 | 1 | 29 |
| 1 | 0 | 0 | 0 | 1 | 1 | 0 | 30 |
| 1 | 0 | 0 | 0 | 0 | 0 | 1 | 31 |
| 0 | 0 | 0 | 0 | 0 | 1 | 0 | 0 |

The counting rules described hereinabove in connection with Table 1 further apply to Table 2. Additionally, at each successive count, $Q_4$ toggles between "0⇌ and "1" only if $Q_3$ of the previous count has a digital value of "1" and if $Q_2$, $Q_1$, $Q_0$ and the "invisible" bit of the previous count each have a digital value of "0". Consistent with the rules of Table 1 and Table 2, the "invisible" bit controls whether a successive count is incremented or decremented relative to the previous count. Importantly, in Table 2, the single transition codes for decimal values 15 and 16 are identical for $Q_3$, $Q_2$, $Q_1$ and $Q_0$. Only $Q_4$ and the "invisible" bit are different between the single transition codes for decimal values 15 and 16. Consequently, decimal value 15 corresponds to decimal value 16, with regard to $Q_3$, $Q_2$, $Q_1$ and $Q_0$. This same corresponding relationship between the single transition codes for decimal values 15 and 16 also exists between the single transition codes for decimal values 14 and 17, 13 and 18, 12 and 19, 11 and 20, 10 and 21, 9 and 22, 8 and 23, 7 and 24, 6 and 25, 5 and 26, 4 and 27, 3 and 28, 2 and 29, 1 and 30, and 0 and 31. Thus, the incrementing single transition counting sequence for the least significant four bits ($Q_3$, $Q_2$, $Q_1$ and $Q_0$) in Table 2 for decimal values 0-15 is reversed or "mirror-imaged" for decimal values 16-31 to a decrementing gray-code counting sequence for the least significant four bits ($Q_3$, $Q_2$, $Q_1$ and $Q_0$) in accordance with Table 1 described further hereinabove in connection with FIG. 4. For example, decimal value 31 is the mirror image of decimal value 0, and decimal value 16 is the mirror image of decimal value 15. Consequently, the least significant four bits of the single transition code in Table 2 may be implemented by any single transition counter having the functionality of gray-code single transition counter 400 of FIG. 4, by first incrementing the 4-bit single transition count from a decimal value of 0 to any specified decimal value from 0 through 15, by then effectively jumping from the specified decimal value to its corresponding decimal value (in accordance with the relationships described further hereinabove) by toggling $Q_4$ and the "invisible" bit without changing the least significant four bits ($Q_3$, $Q_2$, $Q_1$ and $Q_0$), by then decrementing the four bit single transition count to a decimal value of 0 in accordance with Table 1 (which, when $Q_4$ is a 1, is equivalent to incrementing the 5-bit single transition code in Table 2 to a decimal value of 31), and by then effectively jumping from the decimal value of 31 to its corresponding decimal value of 0 by toggling $Q_4$ and the "invisible" bit without changing the least significant four bits ($Q_3$, $Q_2$, $Q_1$ and $Q_0$).

Traditionally, a 5-bit single transition counting circuitry for providing a counting sequence, such as illustrated in Table 2, begins counting at a decimal value of 0 and requires a total of 32 counts in order to return to a decimal value of 0, from which the same sequence of 32 counts may then be repeated. In an important aspect of the preferred embodiment, circuitry 160 achieves a variable single transition counting sequence in which only one output ($Q_4$, $Q_3$, $Q_2$, $Q_1$ or $Q_0$) changes at a particular time in response to a clock signal, and in which a variable number of counts is required to count from a decimal value of 0 through the variable number of counts in order to return to a decimal value of 0, from which the same variable number of counts may then be repeated. For example, circuitry 160 may achieve a variable count of 12, rather than 32, by having 4-bit gray-code single transition counter 166 increment the least significant four bits in Table 2 from decimal value 0 through to decimal value 5. After incrementing to decimal value 5, the next clock signal does not increment the single transition count from decimal value 5 to decimal value 6, but instead simply toggles $Q_4$ and the "invisible" bit, thereby jumping from decimal value 5 to its corresponding decimal value 26 in accordance with the relationship described hereinabove, and thereby placing 4-bit gray-code counter 166 into a decrementing mode. The single transition counting sequence then continues by having 4-bit gray-code single transition counter 166 decrement the least significant four bits ($Q_3$, $Q_2$, $Q_1$ and $Q_0$) in accordance with Table 1. After decrementing the least significant four bits from a decimal value of 5 to a decimal value of 0 (so that the 5-bit gray-code count has a decimal value of 31, given the fact that $Q_4$ has a logic value of "1"), the next clock signal simply toggles $Q_4$ and the "invisible" bit, such that the single transition count returns to decimal value 0 from its corresponding decimal value of 31. After returning to the decimal value of 0, the same sequence of 12 counts (5-bit gray-code count decimal values of 1, 2, 3, 4, 5, 26, 27, 28, 29, 30, 31, 0) may be repeated. Hence, a variable count may be achieved in which any even number of counts may be specified as being required for a single transition count to sequence from a decimal value of 0 through the specified even number of single transition counts in order to return to a decimal value of 0, from which the same variable number of counts may be repeated.

A 32-count sequence may be achieved by toggling $Q_4$ and the "invisible" bit to jump between the single transition codes of decimal value 15 and its corresponding decimal value 16 in accordance with the relationships described further hereinabove. Similarly, a 30-count sequence may be achieved by jumping between the single transition codes of decimal value 14 and its corresponding decimal value 17, a 28-count sequence may be achieved by jumping between the single transition codes of decimal value 13 and its corresponding decimal value 18, a 26-count sequence may be achieved by jumping between the single transition codes of decimal value 12 and its corresponding value 19, a 24-count sequence may be achieved by jumping between the single transition codes of decimal value 11 and its corresponding decimal value 20, a 22-count sequence may be achieved by jumping between the single transition codes of decimal value 10 and its corresponding decimal value 21, a 20-count sequence may be achieved by jumping between the single transition codes of decimal value 9 and its corresponding decimal value 22, a 18-count sequence may be achieved by jumping between the single transition codes of decimal value 8 and its corresponding decimal value 23, a 16-count sequence may be achieved by jumping between the single transition codes of decimal value 7 and its corresponding decimal value 24, a 14-count sequence may be achieved by jumping between the gray-codes of decimal value 6 and its corresponding decimal value 25, a 12-count sequence may be achieved by jumping between the single transition codes of decimal value 5 and its corresponding decimal value 26, a 10-count sequence may be achieved by jumping between the single transition codes of decimal value 4 and its corresponding decimal value 27, an 8-count sequence may be achieved by jumping between the single transition codes of decimal value 3 and its corresponding decimal value 28, a 6-count sequence may be achieved by jumping between the single transition codes of decimal value 2 and its corresponding decimal value 29, a 4-count sequence may be achieved by jumping between the single transition codes of decimal value 1 and its corresponding decimal value 30, and a 2-count sequence may be achieved by jumping between the single transition codes of decimal value 0 and its corresponding decimal value 31. If lower count sequences are desired, then a number of bits of gray-code single transition counter 166 can be reduced. For example, to achieve the 16-count sequence described above, gray-code single transition counter 166 is only required to provide three bits because gray-code single transition counter 166 is only required to count from decimal value 0 through decimal value 7, so that $Q_3$ can be eliminated In all cases, $Q_4$ from flip-flop 170 is the most significant bit of the single transition variable count of circuitry 160 of FIG. 3.

Circuitry 160 may be suitably modified to achieve such a variable gray-code counting sequence for single transition counts having any number of bits. For a single transition count having any number of bits, the most significant bit may be separated from the remaining least significant bits, so that a single transition count formed by the remaining least significant bits is incremented and decremented by any single transition counter having the functionality of gray-code counter 400 of FIG. 4, and so that a variable count may be achieved by moving between the single transition codes of a specified decimal value and a corresponding decimal value by toggling the most significant bit and an "invisible" bit. Consequently, if a single transition code has N number of bits, then a variable single transition count may be achieved having any even number of counts from 2 through $2^N$.

In FIG. 3, circuitry 160 provides a 5-bit single transition count on lines 278a–e, with line 278a ($Q_0$) being the least significant bit, and with line 278e ($Q_4$) being the most significant bit. Circuitry 160 provides a variable single transition count having any even number of counts from 2 through $2^5$ ($2^5=32$). Register 286 latches data input 290 onto data output 284 in response to a positive edge transition of load signal 294. Register 300 latches data input 304 onto comparison data output 298 in response to a positive edge transition of load signal 308. Upon assertion of RESET signal on line 162, "invisible" bit output 264 of flip-flop 174 is set to a logic "1", most significant bit $Q_4$ (output signal 278e of flip-flop 170) is reset to a logic "zero", and output signals 278a–d ($Q_3$, $Q_2$, $Q_1$, $Q_0$) of gray-code single transition counter 166 are each reset to a logic "zero".

Moreover, upon assertion of RESET signal on line 162, input 184 of NAND gate 186 is reset to a logic "zero", resulting in output 188 of NAND gate 186 being set to a logic "one", resulting in output 256 of nor gate 226 being reset to a logic "zero", and resulting in input 190 of NAND gate 192 being set to a logic "one". In the preferred embodiment, node 330 is coupled to node 222. Thus, upon assertion of RESET signal on line 162, output 328 of flip-flop 324 is set to a logic "one", resulting in input 220 of NAND gate 202 being set to a logic "one", resulting in input 216 of NAND gate 208 being reset to a logic "zero", resulting in input 204 of NAND gate 192 being set to a logic "one", and resulting in input 196 of NAND gate 186 being reset to a logic "zero" (because inputs 190 and 204 Of NAND gate 192 are each set to a logic "one" as described above). Since input 216 of NAND gate 208 is set to a logic "zero", output 206 of NAND gate 208 is set to a logic "one", regardless of the logic state of input 212 of NAND gate 208. Since input 190 and input 204 of NAND gate 192 are each set to a logic "one", output 194 of NAND gate 192 is reset to a logic "zero", such that output 188 of NAND gate 186 is set to a logic "one", regardless of the logic states of inputs 184 and 198 of NAND gate 186. Thus, since output 188 of NAND gate 186 is set to a logic "one", output 256 of nor gate 226 is reset to a logic "zero", and output 252 (coupled to clock input 254 of gray-code single transition counter 166) of NOR gate 230 is equal to the logic state of clock signal 178, because clock signal 178 is inverted once by inverter 182 and is then inverted again by NOR gate 230. After reset, input 184 of NAND gate 186 is set to a logic "one".

After reset, upon each positive edge transition of clock signal 178, "invisible" bit output 264 of flip-flop 174 is toggled, and output signals 278a–d ($Q_0$, $Q_1$, $Q_2$, $Q_3$) are incremented by gray-code single transition counter 166 in accordance with the sequence of single transition codes listed hereinabove in Table 1. Moreover, upon each positive edge transition of clock signal 178, output signal 278e ($Q_4$) is unchanged, so long as output 188 of NAND gate 186 is set to a logic "one", such that clock input 258 of flip-flop 170 is reset to a logic "zero" regardless of clock signal 178.

In the preferred embodiment, circuitry 160 provides a 5-bit single transition count, and a variable even number of counts may be achieved by jumping between the single transition codes of a particular decimal value (such as decimal value 11 in Table 2) and its corresponding decimal value (such as decimal value 20 in Table 2) by toggling the "invisible" bit output 264 of flip-flop 174 and by toggling output signal 278e ($Q_4$) of flip-flop 170. For example, in jumping between the single transition codes of decimal values 11 and 20 in Table 2, register 300 latches data input 304 to comparator 276 on comparison data output 298, wherein data input 304 forms the single transition code of decimal value 10 which immediately precedes the single transition code of decimal value 11 in Table 2. Moreover, register 286 latches data input 290 to comparator 272 on comparison data output 284, wherein data input 290 forms the single transition code of decimal value 30 which immediately precedes the single transition code of decimal value 31 in Table 2. Thus, when output signals 278a–e increment to the single transition code of decimal value 10, comparator 276 sets input 318 of NOR gate 314 to a logic "one", resulting in input 322 of flip-flop 324 being reset to a logic "zero". In this manner, flip-flop 324 provides a look-ahead signal in advance of the single transition count from which a jump will occur.

When a next positive edge transition of clock signal 178 occurs, the logic "zero" of input 322 of flip-flop 324 is latched by output 328 of flip-flop 324, and output signals 278a–e increment to the single transition code of decimal value 11 in Table 2, and output 316 of comparator 276 is reset to a logic "zero", and output 320 of NOR gate 314 is set to a logic "one". Since output 328 of flip-flop 324 is reset to a logic "zero", output 200 of NAND gate 202 is set to a logic "one" regardless of the logic state of input 210 of NAND gate 202, and input 216 of NAND gate 208 is set to a logic "one", such that output 206 of NAND gate 208 is inverted from the logic state of input 212 of NAND gate 208. Since inputs 184 and 198 of NANDgate 186 are set to a logic "one" as described above, output 188 of NAND gate 186 is inverted from the logic state of output 194 of NAND gate 192, and output 194 of NAND gate 192 is itself inverted from the logic state of output 206 of NAND gate 208 because input 190 of NAND gate 192 is set to a logic "one" as described above. Consequently, since output 206 of NAND gate 208 is inverted from the logic state of input 212 of NAND gate 208 as described above, output 188 of NAND gate 1S6 is also inverted from the logic state of input 212 of NAND gate 208.

After a positive edge transition of clock signal 178 results in a logic "zero" being latched by output 328 of flip-flop 324, input 232 of NAND gate 234 is reset to a logic "zero" while clock signal 178 is a logic "one", and input 242 of NAND gate 234 is set to a logic "one" while clock signal 178 is a logic "one", such that input 212 of NAND gate 208 is a logic "zero"; however, upon the next negative edge transition of clock signal 178, input 232 of NAND gate 234 transitions from a logic "zero" to a logic "one" prior to input 242 of NAND gate 234 transitioning from a logic "one" to a logic "zero", due to the gate delays of inverters 236, 238, and 240; thus, inputs 232 and 242 are momentarily each equal to a logic "one", resulting in a momentary positive pulse at input 212 of NAND gate 208, thereby resetting output 188 of NAND gate 186 to a logic "zero".

After completion of the momentary pulse at input 212 of NAND gate 208, input 212 of NAND gate 208 is a logic "zero", output 206 of NAND gate 208 is a logic "one", output 194 of NAND gate 192 is a logic "one" because input 190 is a logic "zero", output 200 of NAND gate 202 is a logic "one" because input 220 (coupled to output 328 of flip-flop 324) is a logic "zero", and output 188 of NAND gate 186 remains a logic "zero" because inputs 184, 198, and 196 of NAND gate 186 are each a logic "one".

After a negative edge transition of clock signal 178 resets output 188 of NAND gate 186 to a logic "zero", input 250 of NOR gate 230 is set to a logic "one", such that a positive edge transition of clock input 254 of gray-code single transition counter 166 is disabled. Also, since input 246 of NOR gate 226 is a logic "zero", clock input 258 of flip-flop 170 is equal to the logic state of clock signal 178, because clock signal 178 is inverted once by inverter 182 and is then inverted again by NOR gate 226.

Consequently, after output 188 of NAND gate 186 is reset to a logic "zero", the next positive edge transition of clock signal 178 results in a positive edge transition at clock input 180 of flip-flop ;74 and at clock input 258 of flip-flop 170, resulting in "invisible" bit output 264 of flip-flop 174 being toggled, and in output signal 278e (Q$_4$) of flip-flop 170 being toggled; since input 250 of NOR gate 230 is set to a logic "one", a positive edge transition of clock input 254 of gray-code single transition counter 166 is disabled, such that output signals 278a–d (Q$_0$, Q$_1$, Q$_2$, Q$_3$) are not changed; moreover, the positive edge transition of clock signal 178 results in the logic "one" of input 322 of flip-flop 324 being latched by output 328 of flip-flop 324.

After output 328 of flip-flop 324 transitions from a logic "zero" to a logic "one", input 220 of NAND gate 202 is set to a logic "one", such that output 200 of NAND gate 202 is reset to a logic "zero" upon the next negative edge transition of clock signal 178, due to the momentary positive pulse at input 210 of NAND gate 202 resulting from a negative edge transition of clock signal 178 as described above. When output 200 of NAND gate 202 is reset to a logic "zero", output 188 of NAND gate 186 is set to a logic "one", such that output 194 of NAND gate 192 is reset to a logic "zero" (because input 216 of NAND gate 208 is a logic "zero", such that inputs 204 and 190 of NAND gate 192 are each a logic "one"). When output 194 of NAND gate 192 is reset to a logic "zero", output 188 of NAND gate 186 is latched as a logic "one", thereby enabling positive edge transitions at clock input 254 of gray-code single transition counter 166 in response to clock signal 178, and thereby disabling positive edge transitions at clock input 258 of flip-flop 170.

In a summary of this example, since the single transition code of decimal value 10 is provided to comparator 276, after output signals 278a–e form the single transition code of decimal value 10, the next positive edge transition of clock signal 178 results in output signals 278a–e forming the single transition code of decimal value 11. After output signals 278a–e form the single transition code of decimal value 11, the next negative edge transition of clock signal 178 disables positive edge transitions at clock input 254 of gray-code single transition counter 166 and enables positive edge transitions at clock input 258 of flip-flop 170. After positive edge transitions are enabled at clock input 258 of flip-flop 170, the next positive edge transition of clock signal 178 toggles the "invisible" bit output 264 of flip-flop 174 and further toggles output signal 278e (Q$_4$) of flip-flop 170, while output signals 278a–d are unchanged, thereby jumping from the single transition code of decimal value 11 to the single transition code of decimal value 20 in Table 2. After "invisible" bit output 264 and output signal 278e (Q$_4$) are toggled, the next negative edge transition of clock signal 178 reenables positive edge transitions at clock input 254 of gray-code single transition counter 166 and disables positive edge transitions at clock input 258 of flip-flop 170. After positive edge transitions are re-enabled at clock input 254 of gray-code single transition counter 166, subsequent positive edge transitions of clock signal 178 result in gray-code single transition counter 166 decrementing the 4-bit single transition code on output signals 278a–d, while output signal 278e (Q$_4$) remains a logic "one".

In this example, since the single transition code of decimal value 30 is provided to comparator 272, after output signals 278a–e form the single transition code of decimal value 30, the next positive edge transition of clock signal 178 results in output signals 278a–e forming the single transition code of decimal value 31. After output signals 278a–e form the single transition code of decimal value 31, the next negative edge transition of clock signal 178 disables positive edge transitions at clock input 254 of gray-code single transition counter 166 and enables positive edge transitions at clock input 258 of flip-flop 170. After positive edge transitions are enabled at clock input 258 of flip-flop 170, the next positive edge transition of clock signal 178 toggles the "invisible" bit output 264 of flip-flop 174 and further toggles output signal 278e (Q$_4$) of flip-flop 170, while output signals 278a–d are unchanged, thereby jumping from the single transition code of decimal value 31 to the single transition code of decimal value 0 in Table 2.

Alternatively, the variable count of circuitry 160 can be modified by changing data input 290 and then asserting load signal 294, such that data input 290 is provided to comparator 272 on comparison data output 284. For example, if the single transition code of decimal value 26 is provided to comparator 272, then circuitry 160 jumps from the single transition code of decimal value 27 to its mirror-image single transition code of decimal value 4 in Table 2, in contrast to the example above where circuitry 160 jumps from the single transition code of decimal value 31 to its mirror-image single transition code of decimal value 0.

After "invisible" bit output 264 and output signal 278e (Q$_4$) are toggled, the next negative edge transition of clock signal 178 re-enables positive edge transitions at clock input 254 of gray-code single transition counter 166 and disables positive edge transitions at clock input 258 of flip-flop 170. After positive edge transitions are re-enabled at clock input 254 of gray-code single transition counter 166, subsequent positive edge transitions of clock signal 178 result in gray-code single transition counter 166 incrementing the 4-bit single transition code on output signals 278a–d, while output signal 278e (Q$_4$) remains a logic "zero".

The variable count of circuitry 160 can be modified by changing data input 304 and then asserting load signal 308, such that data input 304 is provided to comparator 276 on comparison data output 298.

In an alternative embodiment, node 222 may be coupled to node 326, rather than to node 330. In this alternative embodiment, if a jump between the single transition codes of decimal value 11 and its corresponding decimal value 20 in Table 2 is desired, then data input 304 specifies the single transition code of decimal value 11 to comparator 276, and data input 290 specifies the single transition code of decimal value 31 to comparator 272, thereby effectively removing flip-flop 324. After output signals 278a-e form the single transition code of decimal value 11, the next negative edge transition of clock input 178 disables positive edge transitions at clock input 254 of gray code counter 166 and enables positive edge transitions at clock input 258 of flip-flop 170. After positive edge transitions are enabled at clock input 258 of flip-flop 170, the next positive edge transition of clock signal 178 toggles "invisible" bit output 264 of flip-flop 174 and further toggles output signal 278e (Q4) of flip-flop 170, while output signals 278a-d are unchanged, thereby jumping between the single transition codes of decimal values 11 and 20 in Table 2. After "invisible" bit output 264 and output signal 278e (Q4) are toggled, the next negative edge transition of clock signal 178 re-enables positive edge transitions at clock input 254 of gray-code single transition counter 166 and disables positive edge transitions at clock input 258 of flip-flop 170.

A shortcoming of this alternative embodiment is that any transition at input 216 of NAND gate 208 resulting from a positive edge transition of clock signal 178 must occur prior to any transition at input 212 of NAND gate 208 resulting from a negative edge transition of clock signal 178, such that a minimum time is required between positive and negative edge transitions of clock signal 178, thereby limiting the counting frequency of circuitry 160.

In the preferred embodiment, by including flip-flop 324, and by providing to comparator 276 a single transition code which immediately precedes the single transition code from which a jump will occur, any transition at input 216 of NAND gate 208 resulting from a positive edge transition of clock signal 178 will occur more quickly than in the alternative embodiment, because the delay path between a positive edge transition of clock signal 178 and any corresponding transition at input 216 of NAND gate 208 is limited to the delays through flip-flop 324 and inverter 218, which is significantly less than the delays in the alternative embodiments of inverter 182, NOR gate 230, gray-code single transition counter 166, comparator 276, NOR gate 314, and inverter 218. In the preferred embodiment, by decreasing the delay between a positive edge transition of clock signal 178 and any corresponding transition at input 216 of NAND gate 208, it is possible for the negative edge transition of clock signal 178 to occur within a shorter time after the positive edge transition, thereby decreasing the minimum time between positive and negative edge transitions of clock signal 178, such that the counting frequency of circuitry of 160 is increased. Similar savings in delay times are realized by coupling output 310 of comparator 272 through NOR gate 314 to input 322 of flip-flop 324, and by providing to comparator 272 a single transition code (single transition code of decimal value 30) which immediately precedes the single transition code from which a jump will occur between the single transition codes of decimal values 31 and 0 in Table 2.

Although the present invention and its advantages have been described in detail, it should be understood that various changes, substitutions and alterations can be made herein without departing from the spirit and scope of the invention as defined by the appended claims.

What is claimed is:

1. Circuitry for variable single transition counting, comprising:
   a count line for providing a count signal;
   a direction control line for outputting a direction control bit;
   a significant bit line for outputting a significant bit;
   a single transition counter coupled to said count line and to said direction control line and operable to increment a first single transition count in response to said count signal and to said direction control bit having an incrementing logic state, and further operable to decrement said first single transition count in response to said count signal and to said direction control bit having a decrementing logic state, wherein said first single transition count and said significant bit together form a second single transition count;
   comparison circuitry coupled to said significant bit line and to said single transition counter for outputting a comparison signal in response to said second single transition count being equal to a preselected value; and
   toggling circuitry coupled to said comparison circuitry, to said single transition counter and to said significant bit line for toggling said direction control bit and said significant bit in response to said comparison signal, such that a value of said second single transition count may be changed in response to said preselected value.

2. The circuitry of claim 1 wherein said toggling circuitry is operable to toggle said direction control bit and said significant bit without modifying said first single transition count.

3. The circuitry of claim 1 wherein said toggling circuitry is further coupled to said count line and is operable to toggle said direction control bit and said significant bit in response to said comparison signal and to a positive edge transition of said count signal.

4. The circuitry of claim 1 wherein said toggling circuitry toggles said direction control bit and said significant bit in response to said comparison signal such that said direction control bit and said significant bit are toggled when said second single transition count is equal to said preselected value.

5. The circuitry of claim 4 wherein said toggling circuitry is further coupled to said count line and wherein said comparison circuitry outputs said comparison signal to said toggling circuitry before a next count signal on said count line, such that said direction control bit and said significant bit are toggled after said next count signal when said second single transition count is equal to said preselected value.

6. The circuitry of claim 1 wherein said toggling circuitry toggles said direction control bit and said significant bit in response to said comparison signal such that said direction control bit and said significant bit are toggled when said second single transition count is equal to a successive value following said preselected value.

7. The circuitry of claim 6 wherein said toggling circuitry is further coupled to said count line and wherein said comparison circuitry outputs said comparison signal to said toggling circuitry after a first next count signal on said count line, such that said direction control bit and said significant bit are toggled after a second next count signal on said count line when said second single transition count is equal to a successive value following said preselected value.

8. The circuitry of claim 1 wherein said direction control bit is output by a latch.

9. The circuitry of claim 1 wherein said significant bit is output by a latch.

10. The circuitry of claim 9 wherein said toggling circuitry is further coupled to said count line and wherein said toggling circuitry toggles said significant bit without modifying said first single transition count by disabling said count signal from said single transition counter and by enabling said count signal to said latch.

11. The circuitry of claim 10 wherein said toggling circuitry disables said count signal from said single transition counter and enables said count signal to said latch in response to a negative edge transition of said count signal.

12. The circuitry of claim 1 wherein said comparison circuitry is operable to output said comparison signal in response to said second single transition count being equal to a second preselected value, such that said value of said second single transition count may be changed in response to said preselected value and to said second preselected value 13. The circuitry of claim 1 and further comprising latch circuitry coupled to said comparison circuitry for latching said preselected value.

14. The circuitry of claim 13 wherein said latch circuitry is operable to change said preselected value in response to a load signal.

15. The circuitry of claim 1 wherein only one bit of said second single transition count is modified in response to each count signal on said count line.

16. A first-in-first-out memory system, comprising:
a plurality of memory locations each for storing data;
a first count line for outputting a first count signal in response to data being written to one of said memory locations;
a write index counter coupled to said first count line for incrementing a write index in response to each said first count signal;
a second count line for outputting a second count signal in response to data being read from one of said memory locations; and
a read index counter coupled to said second count line for incrementing a read index in response to each said second count signal, wherein said write index counter and said read index counter each comprise an associated variable single transition counter comprising:
a direction control line for outputting a direction control bit;
a significant bit line for outputting a significant bit;
a single transition counter coupled to an associated one of said first and second count lines and to said direction control line and operable to increment a first ingle transition count in response to said count signal of said associated count line and to said direction control bit having an incrementing logic state, and further operable to decrement said first single transition count in response to said count signal and to said direction control bit having a decrementing logic state, wherein said first single transition count and said significant bit together form a second single transition count;
comparison circuitry coupled to said significant bit line and to said single transition counter for outputting a comparison signal in response to said second single transition count being equal to a preselected value; and
toggling circuitry coupled to said comparison circuitry, to said single transition counter and to said significant bit line for toggling said direction control bit and said significant bit in response to said comparison signal, such that a value of said second single transition count may be changed in response to said preselected value.

17. The system of claim 16 and further comprising comparison circuitry for comparing said write index against said read index.

18. The system of claim 17 and further comprising indication circuitry coupled to said comparison circuitry for outputting a full flag in response to said write index counter incrementing said write index to equal said read index.

19. The system of claim 17 and further comprising indication circuitry coupled to said comparison circuitry for outputting an empty flag in response to said read index counter incrementing said read index to equal said write index.

20. A method of variable single transition counting, comprising the steps of:
providing a count signal on a count line;
outputting a direction control bit on a direction control line;
outputting a significant bit on a significant bit line;
incrementing a first single transition count in response to said count signal and to said direction control bit having an incrementing logic state;
decrementing said first single transition count in response to said count signal and to said direction control bit having a decrementing logic state, wherein said first single transition count and said significant bit together form a second single transition count;
comparing said second single transition count against a preselected value and outputting a comparison signal in response to said second single transition count being equal to said preselected value; and
toggling said direction control bit and said significant bit in response to said comparison signal, such that a value of said second single transition count may be changed in response to said preselected value.

21. The method of claim 20 wherein said toggling step comprises the step of toggling said direction control bit and said significant bit without modifying said first single transition count.

22. The method of claim 21 wherein said toggling step comprises the steps of:
disabling said count signal from a single transition counter which outputs said first single transition count; and
enabling said count signal to a latch which outputs said significant bit.

23. The method of claim 22 wherein said disabling step comprises the step of disabling said count signal from said single transition counter in response to a negative edge transition of said count signal, and wherein said enabling step comprises the step of enabling said count signal to said latch in response to said negative edge transition of said count signal.

24. The method of claim 20 wherein said toggling step comprises the step of toggling said direction control bit and said significant bit in response to said comparison signal and to a positive edge transition of said count signal.

25. The method of claim 20 wherein said toggling step comprises the step of toggling said direction control bit and said significant bit in response to said comparison signal such that said direction control bit and said significant bit are toggled when said second single transition count is equal to said preselected value.

26. The method of claim 25 wherein said comparing step comprises the step of outputting said comparison signal before a next count signal on said count line, such that said direction control bit and said significant bit are toggled after said next count signal when said second single transition count is equal to said preselected value.

27. The method of claim 20 wherein said toggling step comprises the step of toggling said direction control bit and said significant bit in response to said comparison signal such that said direction control bit and said significant bit are toggled when said second single transition count is equal to a successive value following said preselected value.

28. The method of claim 27 wherein said comparing step comprises the step of outputting said comparison signal after a first next count signal on said count line, such that said direction control bit and said significant bit are toggled after a second next count signal on said count line when said second single transition count is equal to a successive value following said preselected value.

29. The method of claim 20 wherein said comparing step comprises the step of outputting said comparison signal in response to said second single transition count being equal to a second preselected value, such that said value of said second single transition count may be changed in response to said preselected value and to said second preselected value.

30. The method of claim 20 and further comprising the step of changing said preselected value in response to a load signal.

31. The method of claim 20 wherein only one bit of said second single transition count is modified in response to each count signal on said count line.

* * * * *